US012744549B2

(12) United States Patent
Jamshidi et al.

(10) Patent No.: US 12,744,549 B2
(45) Date of Patent: Sep. 22, 2026

(54) COMPRESSION METADATA VALUE INDUCED READ AND WRITE OPERATION CONSERVATION

(71) Applicant: Apple Inc., Cupertino, CA (US)

(72) Inventors: Davoud A. Jamshidi, San Jose, CA (US); Justin A. Hensley, Mountain View, CA (US); Tyson J. Bergland, Sunnyvale, CA (US); Karthik Ramani, San Jose, CA (US)

(73) Assignee: Apple Inc., Cupertino, CA (US)

( * ) Notice: Subject to any disclaimer, the term of this patent is extended or adjusted under 35 U.S.C. 154(b) by 19 days.

(21) Appl. No.: 18/949,366

(22) Filed: Nov. 15, 2024

(65) Prior Publication Data

US 2026/0088831 A1 Mar. 26, 2026

Related U.S. Application Data

(60) Provisional application No. 63/698,339, filed on Sep. 24, 2024.

(51) Int. Cl.
*H03M 7/30* (2006.01)

(52) U.S. Cl.
CPC ....... *H03M 7/6058* (2013.01); *H03M 7/6005* (2013.01); *H03M 7/6011* (2013.01); *H03M 7/3059* (2013.01); *H03M 7/3073* (2013.01)

(58) Field of Classification Search
CPC ............. H03M 7/6005; H03M 7/6058; H03M 7/6011; H03M 7/3073; H03M 7/6094
See application file for complete search history.

(56) References Cited

U.S. PATENT DOCUMENTS

| | | | | |
|---|---|---|---|---|
| 10,062,143 | B2 | 8/2018 | Brennan et al. | |
| 11,069,023 | B2 | 7/2021 | Rangan | |
| 11,763,515 | B2 | 9/2023 | Burke et al. | |
| 2020/0279433 | A1 | 9/2020 | Matlage et al. | |
| 2023/0096188 | A1 | 3/2023 | Szerszen et al. | |
| 2023/0205704 | A1 * | 6/2023 | Surti | G06F 12/0897 711/122 |
| 2023/0306551 | A1 | 9/2023 | Krishnan et al. | |

FOREIGN PATENT DOCUMENTS

| | | | |
|---|---|---|---|
| CN | 117220685 | A | 12/2023 |
| JP | 2002330432 | A | 11/2002 |
| KR | 20200144401 | A | 12/2020 |
| KR | 102638468 | B1 | 2/2024 |

* cited by examiner

*Primary Examiner* — Joseph J Lauture
(74) *Attorney, Agent, or Firm* — Kowert, Hood, Munyon, Rankin & Goetzel, P.C.; Deann M. Munyon

(57) ABSTRACT

In disclosed embodiments, compression circuitry may compress data blocks and compressed write data blocks and corresponding compression metadata to a certain level in a cache/memory hierarchy. In some embodiments, the compression circuitry is configured to detect a pre-determined set of data values in a block of data to be compressed. In response, the compression circuitry may write a special metadata value for the data block to data storage circuitry to indicate compression of the data block, without writing a compressed version of the data block to the data storage circuitry. This may advantageously improve performance and reduce power consumption for data blocks with certain data values (e.g., having uniform pixel/texel values).

20 Claims, 11 Drawing Sheets

*Write, for the data block determined to have the pre-determined set of data values, a first metadata value for the data block to the second data storage circuitry to indicate compression of the data block, without writing a compressed version of the data block to the second data storage circuitry*
830

COMPRESSION METADATA VALUE INDUCED READ AND WRITE OPERATION CONSERVATION

The present application claims priority to U.S. Provisional App. No. 63/698,339, entitled "Compression Metadata Value Induced Read and Write Operation Conservation," filed on Sep. 24, 2024, the disclosure of which is incorporated by reference herein in its entirety.

BACKGROUND

Technical Field

This disclosure relates generally to graphics processors and more particularly to techniques for compressing and decompressing data.

Description of Related Art

Modern computing devices often include graphics processing units (GPUs) that are configured to perform specialized data processing tasks. GPUs may operate on large data sets, such as surface data, matrix data structures, machine learning data, etc. Therefore, GPUs often utilize substantial memory bandwidth when accessing these data sets. At least some data may be compressed at one or more levels of a cache/memory hierarchy and a GPU may also store metadata associated with the compression. Generally, improvements to GPU memory accesses may improve performance, reduce power consumption, or both.

DETAILED DESCRIPTION

Figure 1A:
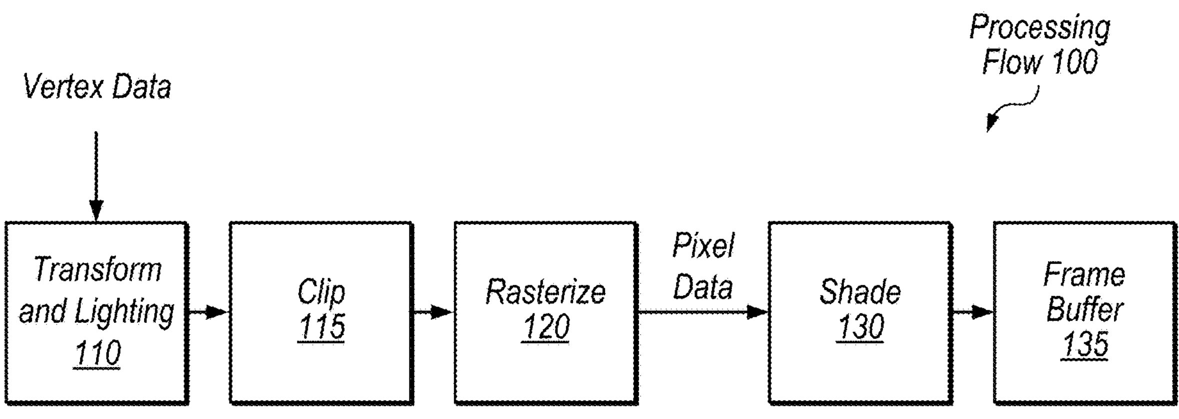
FIG. 1A is a flow diagram illustrating an example processing flow for processing graphics data, according to some embodiments.

Processor circuitry, such as a GPU, may compress data for storage at certain in a memory hierarchy. The processor may generate metadata for compressed data blocks that indicates parameters associated with the compressed data block. Compression parameters may include the size of the compressed data block, a pointer to a location of the compressed data block, an identifier of the compression algorithm used to compress the data block, or a combination thereof. The compression metadata may be stored in the memory hierarchy along with the compressed data. Therefore, reads and writes of compressed data may traditionally involve accessing both metadata and the corresponding compressed data. Generally, reducing certain memory accesses in a processor may reduce power consumption and improve performance (e.g., by freeing memory bandwidth for other accesses).

In disclosed embodiments, compression circuitry is configured to utilize special metadata values to represent pre-determined data block values. In these embodiments, the processor is configured to read or write metadata only for these pre-determined data block values, at a certain level in the memory hierarchy, and not corresponding compressed data. This may substantially reduce memory bandwidth. For example, consider an implementation in which a level 1 (L1) data cache stores uncompressed data and a level 2 (L2) data cache stores compressed data. When reading from the L2 data cache, decompression circuitry may read a fast clear metadata value and refrain from reading data from the L2 data cache (but rather generate a pre-determined decompressed data block in the L1 cache based on the fast clear metadata value). Similarly, when writing to the L2 cache, compressor circuitry may write a fast clear metadata value without writing any corresponding data block value. Similar techniques may be implemented at other cache levels, e.g., in the context of a texture cache of a graphics processor.

Pre-determined data block values may be relevant in various scenarios. For example, if the data is pixel data, the pre-determined set of values may correspond to all of the pixels having a particular color (e.g., black) or having a pattern that includes a small number of repeated colors. Some embodiments of the special metadata values may be referred to as "fast clear" metadata values. As another example, if the data corresponds to entries of an array, the pre-determined set of values may be zeros, e.g., for a portion of a sparse matrix.

Note that special metadata values may be handled by software, hardware, or both. In some embodiments, hardware (e.g., compressor circuitry) is configured to recognize pre-determined data block values and generate corresponding special metadata values, without software intervention. Example hardware compressor embodiments are discussed below with reference to FIG. 4. This may improve further performance and enable use of disclosed techniques in situations where software is not aware of the pre-determined data block values.

Further, in some embodiments, certain compression operations may be implemented by buffer circuitry (e.g., configured to buffer graphics frame data in tile-based deferred rendering (TBDR) architectures). In these embodiments, to reduce bandwidth to the buffer circuitry, the processor may execute a broadcast instruction that may include a single metadata value (e.g., a special metadata value) or a single pixel value. The processor may issue a co-processor command with the pixel/metadata value to the buffer circuitry, which may in turn control its compression circuitry to handle the metadata value or replicate the pixel value across a data block. This may substantially reduce bandwidth relative to providing data blocks to the buffer circuitry. Example broadcast instructions/commands are discussed below with reference to FIGS. 6-7C. Still further, in some embodiments, a programming interface may allow developers to differentiate between disclosed fast clear techniques and other techniques such as first-valid-pixel fill, as discussed below with reference to FIG. 5.

GPU Overview

Referring to FIG. 1A, a flow diagram illustrating an example processing flow 100 for processing graphics data is shown. In some embodiments, transform and lighting procedure 110 may involve processing lighting information for vertices received from an application based on defined light source locations, reflectance, etc., assembling the vertices into polygons (e.g., triangles), and transforming the polygons to the correct size and orientation based on position in a three-dimensional space. Clip procedure 115 may involve discarding polygons or vertices that fall outside of a viewable area. In some embodiments, geometry processing may utilize object shaders and mesh shaders for flexibility and efficient processing prior to rasterization. Rasterize procedure 120 may involve defining fragments within each polygon and assigning initial color values for each fragment, e.g., based on texture coordinates of the vertices of the polygon. Fragments may specify attributes for pixels which they overlap, but the actual pixel attributes may be determined based on combining multiple fragments (e.g., in a frame buffer), ignoring one or more fragments (e.g., if they are covered by other objects), or both. Shade procedure 130 may involve altering pixel components based on lighting, shadows, bump mapping, translucency, etc. Shaded pixels may be assembled in a frame buffer 135. Modern GPUs typically include programmable shaders that allow customization of shading and other processing procedures by application developers. Thus, in various embodiments, the example elements of FIG. 1A may be performed in various orders, performed in parallel, or omitted. Additional processing procedures may also be implemented.

Figure 1B:
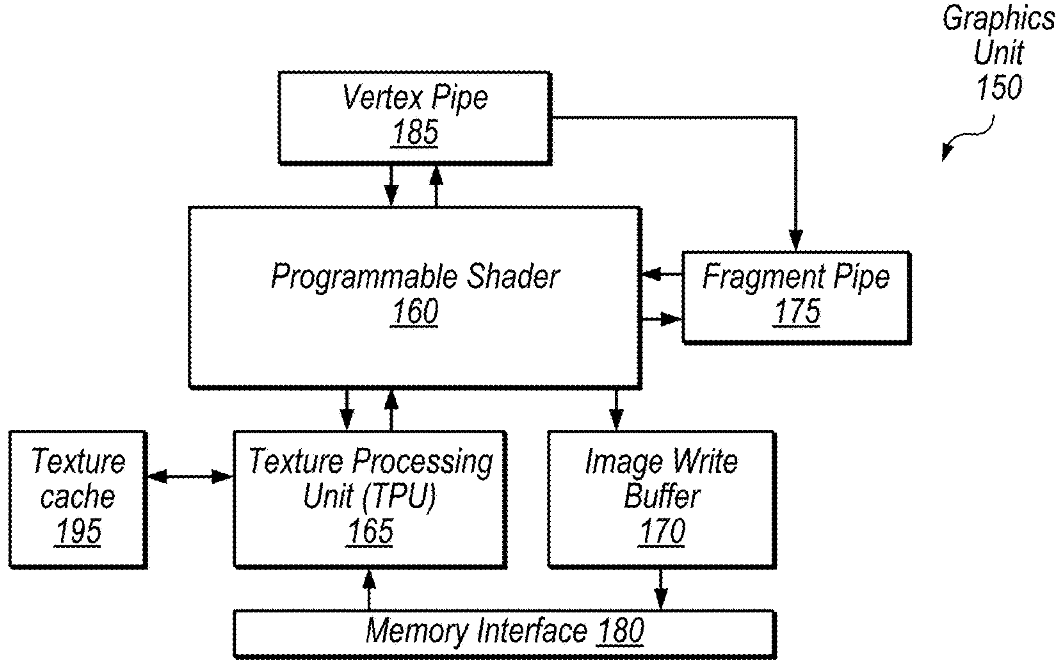
FIG. 1B is a block diagram illustrating a graphics unit, according to some embodiments

Referring now to FIG. 1B, a simplified block diagram illustrating graphics unit 150 is shown, according to some embodiments. In the illustrated embodiment, graphics unit 150 includes programmable shader 160, vertex pipe 185, fragment pipe 175, texture processing unit (TPU) 165, image write buffer 170, and memory interface 180. In some embodiments, graphics unit 150 is configured to process both vertex and fragment data using programmable shader 160, which may be configured to process graphics data in parallel using multiple execution pipelines or instances.

Vertex pipe 185, in the illustrated embodiment, may include various fixed-function hardware configured to process vertex data. Vertex pipe 185 may be configured to communicate with programmable shader 160 to coordinate vertex processing. In the illustrated embodiment, vertex pipe 185 is configured to send processed data to fragment pipe 175 or programmable shader 160 for further processing.

Fragment pipe 175, in the illustrated embodiment, may include various fixed-function hardware configured to process pixel data. Fragment pipe 175 may be configured to communicate with programmable shader 160 to coordinate fragment processing. Fragment pipe 175 may be configured to perform rasterization on polygons from vertex pipe 185 or programmable shader 160 to generate fragment data. Vertex pipe 185 and fragment pipe 175 may be coupled to memory interface 180 (coupling not shown to access graphics data.

Programmable shader 160, in the illustrated embodiment, is configured to receive vertex data from vertex pipe 185 and fragment data from fragment pipe 175 and TPU 165. Programmable shader 160 may be configured to perform vertex processing tasks on vertex data which may include various transformations and adjustments of vertex data. Programmable shader 160, in the illustrated embodiment, is also configured to perform fragment processing tasks on pixel data such as texturing and shading, for example. Programmable shader 160 may include multiple sets of multiple execution pipelines for processing data in parallel.

In some embodiments, programmable shader 160 includes pipelines configured to execute one or more different SIMD groups in parallel. Each pipeline may include various stages configured to perform operations in a given clock cycle, such as fetch, decode, issue, execute, etc. The concept of a processor "pipeline" is well understood, and refers to the concept of splitting the "work" a processor performs on instructions into multiple stages. In some embodiments, instruction decode, dispatch, execution (i.e., performance), and retirement may be examples of different pipeline stages. Many different pipeline architectures are possible with varying orderings of elements/portions. Various pipeline stages perform such steps on an instruction during one or more processor clock cycles, then pass the instruction or operations associated with the instruction on to other stages for further processing.

The term "SIMD group" is intended to be interpreted according to its well-understood meaning, which includes a set of threads for which processing hardware processes the same instruction in parallel using different input data for the different threads. SIMD groups may also be referred to as SIMT (single-instruction, multiple-thread) groups, single instruction parallel thread (SIPT), or lane-stacked threads. Various types of computer processors may include sets of pipelines configured to execute SIMD instructions. For example, graphics processors often include programmable shader cores that are configured to execute instructions for a set of related threads in a SIMD fashion. Other examples of names that may be used for a SIMD group include: a wavefront, a clique, or a warp. A SIMD group may be a part of a larger threadgroup of threads that execute the same program, which may be broken up into a number of SIMD groups (within which threads may execute in lockstep) based on the parallel processing capabilities of a computer. In some embodiments, each thread is assigned to a hardware pipeline (which may be referred to as a "lane") that fetches operands for that thread and performs the specified operations in parallel with other pipelines for the set of threads. Note that processors may have a large number of pipelines such that multiple separate SIMD groups may also execute in parallel. In some embodiments, each thread has private operand storage, e.g., in a register file. Thus, a read of a particular register from the register file may provide the version of the register for each thread in a SIMD group.

As used herein, the term "thread" includes its well-understood meaning in the art and refers to sequence of program instructions that can be scheduled for execution independently of other threads. Multiple threads may be included in a SIMD group to execute in lock-step. Multiple threads may be included in a task or process (which may correspond to a computer program). Threads of a given task may or may not share resources such as registers and memory. Thus, context switches may or may not be performed when switching between threads of the same task.

In some embodiments, multiple programmable shader units 160 are included in a GPU. In these embodiments, global control circuitry may assign work to the different sub-portions of the GPU which may in turn assign work to shader cores to be processed by shader pipelines.

TPU 165, in the illustrated embodiment, is configured to schedule fragment processing tasks from programmable shader 160. In some embodiments, TPU 165 is configured to pre-fetch texture data and assign initial colors to fragments for further processing by programmable shader 160 (e.g., via memory interface 180). TPU 165 may be configured to provide fragment components in normalized integer formats or floating-point formats, for example. In some embodiments, TPU 165 is configured to provide fragments in groups of four (a "fragment quad") in a 2×2 format to be processed by a group of four execution pipelines in programmable shader 160.

Image write buffer 170, in some embodiments, is configured to store processed tiles of an image and may perform operations to a rendered image before it is transferred for display or to memory for storage. In some embodiments, graphics unit 150 is configured to perform tile-based deferred rendering (TBDR). In tile-based rendering, different portions of the screen space (e.g., squares or rectangles of pixels) may be processed separately. Memory interface 180 may facilitate communications with one or more of various memory hierarchies in various embodiments.

As discussed above, graphics processors typically include specialized circuitry configured to perform certain graphics processing operations requested by a computing system. This may include fixed-function vertex processing circuitry, pixel processing circuitry, or texture sampling circuitry, for example. Graphics processors may also execute non-graphics compute tasks that may use GPU shader cores but may not use fixed-function graphics hardware. As one example, machine learning workloads (which may include inference, training, or both) are often assigned to GPUs because of their parallel processing capabilities. Thus, compute kernels executed by the GPU may include program instructions that specify machine learning tasks such as implementing neural network layers or other aspects of machine learning models to be executed by GPU shaders. In some scenarios, non-graphics workloads may also utilize specialized graphics circuitry, e.g., for a different purpose than originally intended.

Further, various circuitry and techniques discussed herein with reference to graphics processors may be implemented in other types of processors in other embodiments. Other types of processors may include general-purpose processors such as CPUs or machine learning or artificial intelligence accelerators with specialized parallel processing capabilities. These other types of processors may not be configured to execute graphics instructions or perform graphics operations. For example, other types of processors may not include fixed-function hardware that is included in typical GPUs. Machine learning accelerators may include specialized hardware for certain operations such as implementing neural network layers or other aspects of machine learning models. Speaking generally, there may be design tradeoffs between the memory requirements, computation capabilities, power consumption, and programmability of machine learning accelerators. Therefore, different implementations may focus on different performance goals. Developers may select from among multiple potential hardware targets for a given machine learning application, e.g., from among generic processors, GPUs, and different specialized machine learning accelerators.

Figure 2:
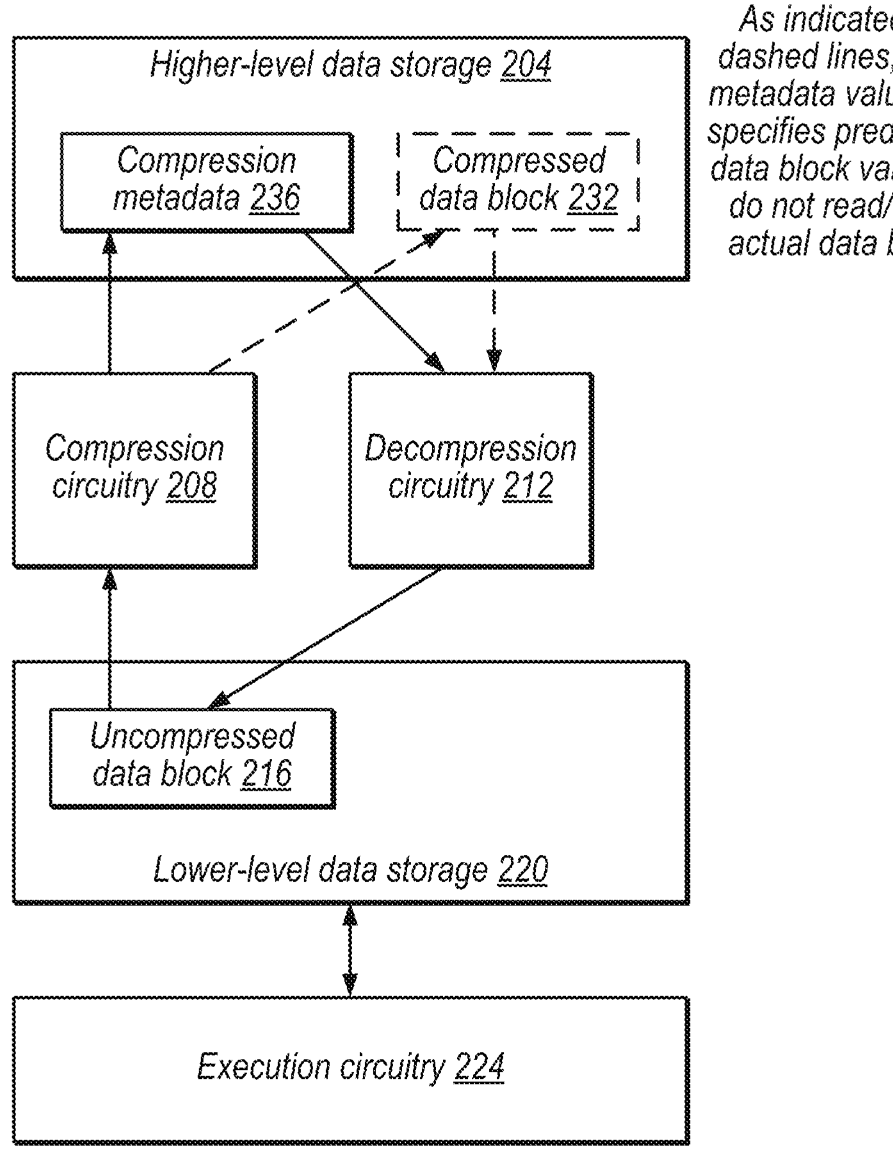
FIG. 2 is a block diagram illustrating example compression and decompression circuitry configured to implement special metadata value(s) for predefined data block values, according to some embodiments.

Overview of Special Metadata Values Corresponding to Pre-Determined Data Block Values FIG. 2 is a block diagram illustrating example compression and decompression circuitry configured to implement special metadata value(s) for predefined data block values, according to some embodiments. In the illustrated example, the dashed lines show that special metadata values in compression metadata 236 may allow for skipping reads and writes of compressed data block 232 in certain scenarios. Depicted in FIG. 2 are execution circuitry 224, lower-level data storage 220, compression circuitry 208, decompression circuitry 1212, and higher-level data storage 204.

Execution circuitry 224, in some embodiments, is configured to execute instructions that operate on data in lower-level data storage 220. For example, execution circuitry 224 may include one or more processor pipelines that include execution configured to various instructions such as arithmetic operations, load/store operations, etc. Note that there may be one or more additional levels of operand storage between lower-level data storage 220 and execution circuitry 224, in some embodiments.

Lower-level data storage 220 and higher-level data storage 204, in some embodiments, are cache memories in a memory hierarchy. For example, lower-level data storage 220 and higher-level data storage 204 may correspond, respectively, to a texture cache (e.g., texture cache 195) and an L1 cache, an L1 cache and an L2 cache, an L2 cache and an L3 cache, or the like. In the illustrated embodiment, uncompressed data is stored in lower-level data storage 220, while compressed data is stored in higher-level data storage 204. This may reduce bandwidth between the storage levels, improve efficiency of higher-level data storage 204, etc., relative to not compressing data between the storage levels. Note that some data (not shown) may be stored in higher-level data storage 204 in non-compressed form.

The following discussion provides an example of compression and decompression of a data block, followed by another example in which a special metadata value is used to avoid writing and reading a compressed data block in higher-level data storage 204. Example techniques for using such a special metadata value are discussed in further detail below with reference to FIGS. 3A-3B.

To compress uncompressed data block 216, compression circuitry 208 may apply any algorithms for lossless or lossy compression. For example, compression circuitry 208 may apply lossless compression techniques as described in U.S. patent application Ser. No. 16/855,459 entitled "Lossless Compression Techniques," filed on Apr. 22, 2020 and incorporated herein by this reference in its entirety. As another example, compression circuitry 208 may apply lossy compression techniques described in U.S. patent application Ser. No. 16/855,540 entitled "Lossy Compression Techniques," filed on Apr. 22, 2020 and incorporated herein in its entirety by this reference. In some embodiments, control circuitry may select between lossy or lossless compression based on various operating parameters.

Compression circuitry 208 may initiate a compression operation based on various trigger occurrences. For example, compression may be triggered based on an eviction from lower-level data storage 220, based on aggregation of a data block 216 in lower-level data storage 220, based on software control, etc. Compression circuitry 208 may select a compression scheme for block 216 and apply the compression scheme to generate a compressed data block (e.g., block 232). Compression circuitry 208 may also generate compression metadata 236 describing the compression and store both the compression metadata 236 and the compressed data block 232 in higher-level data storage 204. Compression circuitry 208 may determine to use a special metadata value in different ways, e.g., based on a software signal, based on analysis of the uncompressed data block, etc. The special metadata value may be encoded using various techniques. As one example, one field of the metadata may include N bits and one or more values of this field may be used for special metadata values. As another example, a flag (e.g., a single bit) in the metadata may indicate that a special metadata value is included and another field may be used to indicate one or multiple supported special metadata values.

Note that hardware or software may also write a special metadata value to compression metadata 236 without using compression circuitry 208. For example, a store instruction may be executed to write a special metadata value to the appropriate memory address. Decompression circuitry, when reading a compressed data block (e.g., in response to a load instruction, a cache fill operation to lower-level data storage 220, etc.) also reads the corresponding compression metadata 236 and uses the metadata 236 to determine how to decompress the compressed data block 232, e.g., to provide the uncompressed data back to lower-level data storage 220.

As shown using the dashed lines, for pre-determined data block values (e.g., a texture having texels that are all the same color, a compute data structure with all entries having the same value, etc.), compression circuitry may generate a special metadata value and write only the compression metadata to higher-level data storage 204. For decompression, if decompression circuitry 212 detects a special metadata value, it may generate the uncompressed data block 216 in lower-level data storage 220 (e.g., with values based on the value of the special metadata value) without reading a compressed data block from higher-level data storage 204.

Note that compression/decompression circuitry may be included at multiple different levels in a cache/memory hierarchy. Disclosed techniques using special metadata values may therefore be used at multiple such levels.

Figure 3A:
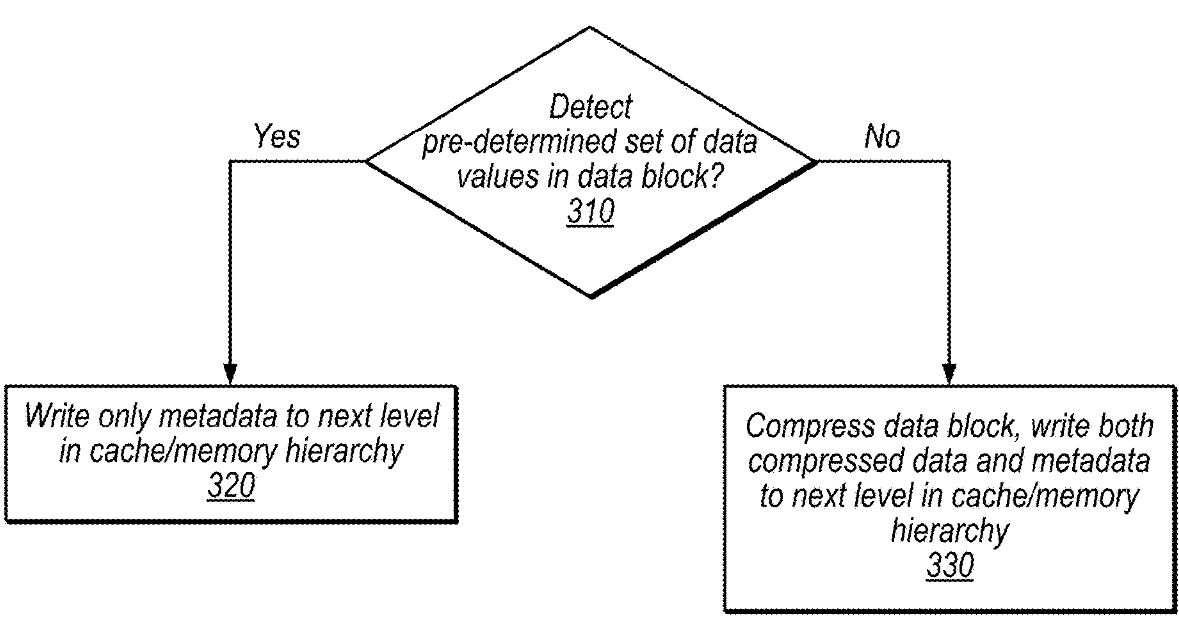
FIG. 3A is a flow diagram depicting example compression techniques, according to some embodiments.

FIG. 3A is a flow diagram depicting example compression techniques, according to some embodiments. At 310, compression circuitry 208 may detect a pre-determined set of data values in a data block. This may be based on a software instruction that indicates the pre-determined set of values (e.g., by specifying a special metadata value), based on analyzing the data block, etc. The data pattern may correspond to a uniform set of data values. For example, the data pattern may correspond to pixel data values having a uniform color (e.g., all black, mostly black, etc.). As another example, the data pattern may include or correspond to an array in which certain entries have a value of "1," corresponding, for example, to a matrix in which all entries of the diagonal have a value of "1."

At 320, in response to detection of the data pattern in uncompressed data block 216, compression circuity 208 is configured to write only compression metadata 236 in higher-level data storage 204, obviating an operation in which compression circuitry 208 also writes compressed data block 232 to higher-level data storage 204. Conversely, at 330, in response to detection of data values other than the data pattern in uncompressed data block 216, compression circuitry 208 is configured to compress data block 216 to generate both compression metadata 236 and compressed data block 232, both of which compression circuitry 208 writes to higher-level data storage 204. For example, data values other than the data pattern in uncompressed data block 116 may correspond to data having non-uniform values or otherwise lacking a pattern.

Figure 3B:
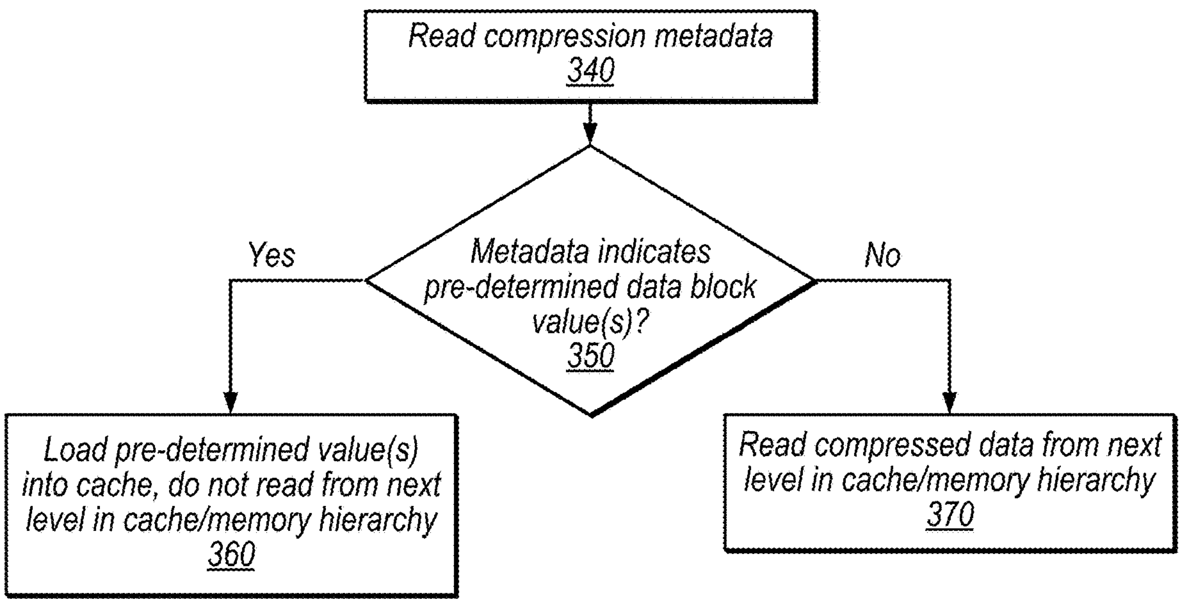
FIG. 3B is a flow diagram depicting example decompression techniques, according to some embodiments.

FIG. 3B is a flow diagram depicting example decompression techniques, according to some embodiments. At 340, decompression circuitry 212 reads compression metadata 236. At 350, decompression circuitry 212 determines whether the metadata value of a plurality of metadata values is included in compression metadata 236. In response to detection of the metadata value, at 360, decompression circuitry 212 is configured to load a pre-determined set of data values to uncompressed data block 216 stored in lower-level data storage 220 without reading the corresponding compressed data block 232 stored in higher-level data storage 204. The pre-determined set of data values may include or correspond to the data pattern (e.g., all black pixels). In some embodiments, each metadata value of a plurality of metadata values may correspond to different data patterns. For instance, a first metadata value in compression metadata 236 may indicate a first data pattern (e.g., all black pixels), while a second metadata value in compression metadata 236 may indicate a second data pattern (e.g., all red pixels). Conversely, in response to failing to detect the metadata value in compression metadata 236, at 370, decompression circuitry 212 is configured to read compressed data block 232 in higher-level data storage 204 to decompress compressed data block 232 and write uncompressed data block 216 to lower-level data storage 220. Additionally, a special metadata value may indicate one or more operations to perform when generating uncompressed data block 216. For example, the special metadata value may indicate to perform a function such as a transform operation. The function may operate on a predetermined data pattern (when not accessing compressed data due to a special metadata value) or on compressed data accessed from memory, to generate uncompressed data block 216. For instance, decompression circuitry 212 may, based on the metadata value, apply a function or a transform operation to uncompressed data block 216 to facilitate subsequent compression of uncompressed data block 216.

Example Hardware Support for Fast Clear Operations

Figure 4:
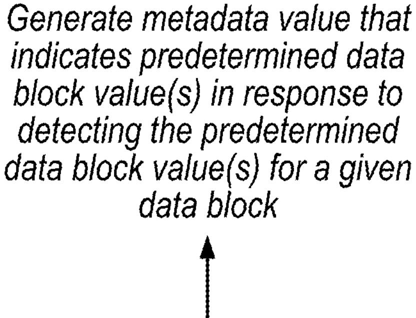
FIG. 4 a block diagram that depicts example hardware configured to identify the presence of pre-determined data block values in uncompressed data, according to some embodiments.
Figure 4:
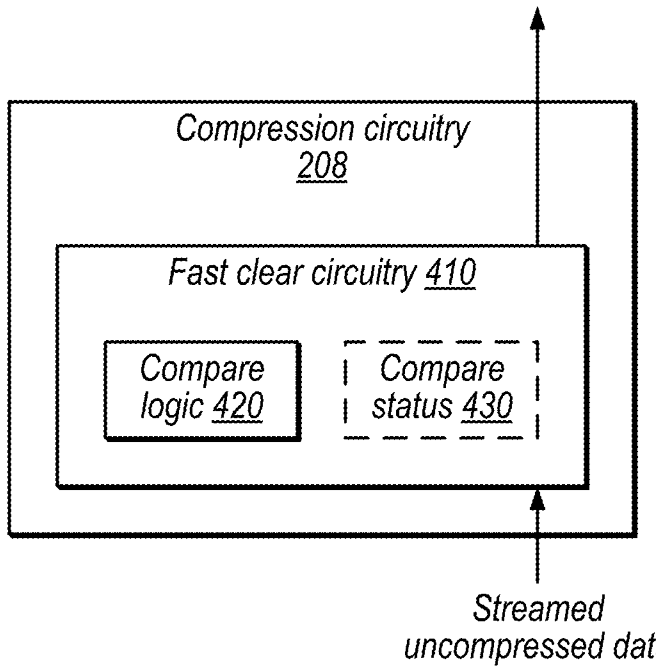

FIG. 4 is a block diagram that depicts example hardware configured to identify the presence of pre-determined data block values in uncompressed data, according to some embodiments. Compression circuitry 208, in this example, includes fast clear circuitry 410 that is specialized circuitry configured to accelerate detection of data blocks with pre-determined values, e.g., in the context of elements 310 and 320 of FIG. 3A.

Fast clear circuitry 410, in the illustrated embodiment, includes compare logic 420 and is configured to store compare status information 430. Compare logic 420 may correspond to a digital comparator. Accordingly, an example implementation of compare logic 420 may include one or more exclusive or (XOR) and AND gates configured to identify a pattern in data provided to compare logic 420. In some embodiments, compare logic 420 additionally may include sequential logic to store data for subsequent comparison.

During operation, fast clear circuitry 410 is configured to receive streamed uncompressed data, such as data from uncompressed data block 216. Compare logic 420 is configured to identify a pattern in the streamed uncompressed data if such a pattern exists. For example, in the context of texture data, to identify the pattern, compare logic 420 may compare a first pixel of the streamed uncompressed data to supported fast-clear colors. To illustrate, compare logic 420 may determine whether the first pixel in the stream of uncompressed data is black (where black is in a set of one or more supported colors). In response to determining that the first pixel is black, compare logic 420 may compare values of subsequent pixels to determine whether the subsequent pixels are black. In response to determining that the subsequent pixels in the stream of uncompressed data are black, compare logic 420 may indicate the presence of a pattern in the streamed uncompressed data via compare status 430. Compare status 430 may be a bit that is set by compare logic 420 to indicate the presence of a pattern in streamed uncompressed data. For example, compare status 430 may be set when a supported color or value is recognized and cleared when any incoming streamed data does not match (in which case traditional compression may be performed instead of a fast clear operation). Alternatively, compare status 430 may be a register with values indicating the presence of different patterns in instances of streamed uncompressed data. For instance, a first sequence of bits in compare status 430 (e.g., a register) may indicate that streamed uncompressed data has a first data pattern, while a second sequence of bits in compare status 430 may indicate that streamed uncompressed data has a second, distinct data pattern from the first data pattern.

In response to identifying that the streamed uncompressed data includes the pattern corresponding to the predetermined set of values, compression circuitry 208 is configured to generate a metadata value that indicates the presence of the predetermined set of values in the streamed uncompressed data. Additionally, compression circuitry 208 is configured to write the metadata value to compression metadata 236 in higher-level data storage 204 without writing corresponding compressed data block 232. Note that compression circuitry 108 may perform these operations without any software indication of the fast clear situation, in some embodiments.

Identifying a data pattern in streamed uncompressed data via specialized fast clear circuitry 410 may improve performance, reduce power consumption, or both relative to software-only implementation. While FIG. 4 shows that specialized fast clear circuitry 410 may perform the fast-clear operation, in some embodiments, software executed by execution circuitry 224 may configure execution circuitry 224 to perform fast-clear operations in addition or alternatively.

Example Techniques to Distinguish Fast Clear and First-Valid-Pixel-Fill

In some embodiments, special metadata values used for fast clear may overlap with special metadata values used for other purposes. In this situation, the system may determine whether to perform fast clear or some other operations based on state information, which may be set via a programming interface. As one example, one or more metadata values used for fast clear may also be used to indicate a first-valid-pixel-fill operation. A first-valid-pixel-fill may involve filling a block of data for compression using the value of a first received valid pixel.

Figure 5:
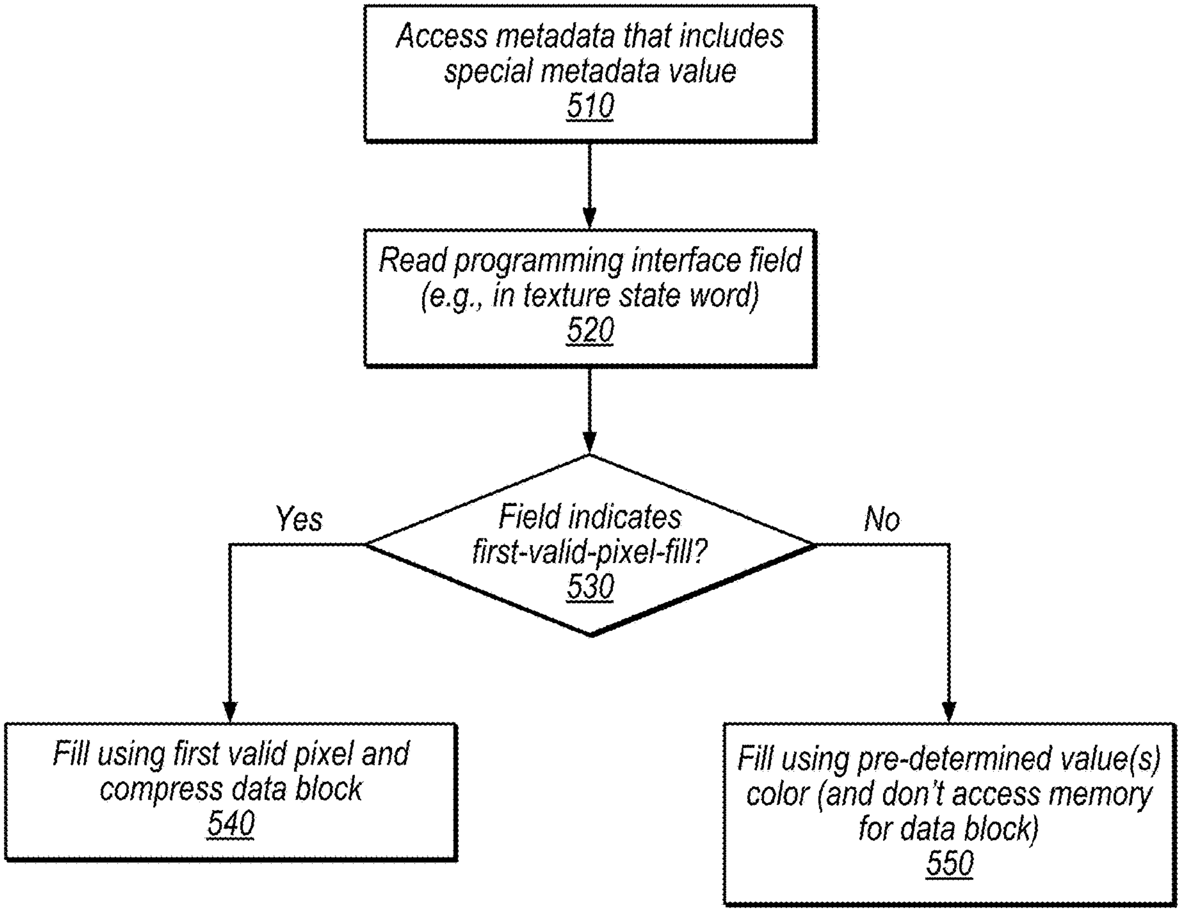
FIG. 5 is a flow diagram depicting example techniques for differentiating between special metadata values and first-valid-pixel-fill operations, according to some embodiments.

FIG. 5 is a flow diagram depicting example techniques for differentiating between special metadata values and first-valid-pixel-fill operations, according to some embodiments. In this example, texture state word information indicates whether to perform first-valid-pixel fill or a fast clear operation.

At 510, in the illustrated example, compression circuitry 208 accesses metadata that includes a special metadata value. At 520, the compression circuitry reads a programming interface field, such as might be included in a texture state word of texture data corresponding to uncompressed data block 216. At 530, control circuitry determines whether the field indicates to perform a first-valid-pixel-fill operation. If so, flow proceeds to 540 and compression circuitry 208 fills the data block pixel data corresponding to the first valid pixel and compresses the data block.

Otherwise, flow proceeds to 550 and compression circuitry 208 performs a fast-clear operation, including to write the metadata value to compression metadata 236 in higher-level data storage 204, without writing corresponding compressed data block 232 to higher-level data storage 204.

Example Broadcast Instruction/Command

In some embodiments, compression circuitry may be included in specialized circuitry configured to operate in conjunction with another processor. As one example, image write buffer 170 may include compression circuitry configured to operate based on instructions executed by programmable shader 160. In these embodiments, it may be desirable to reduce bandwidth between the processor and the specialized circuitry.

Figure 6:
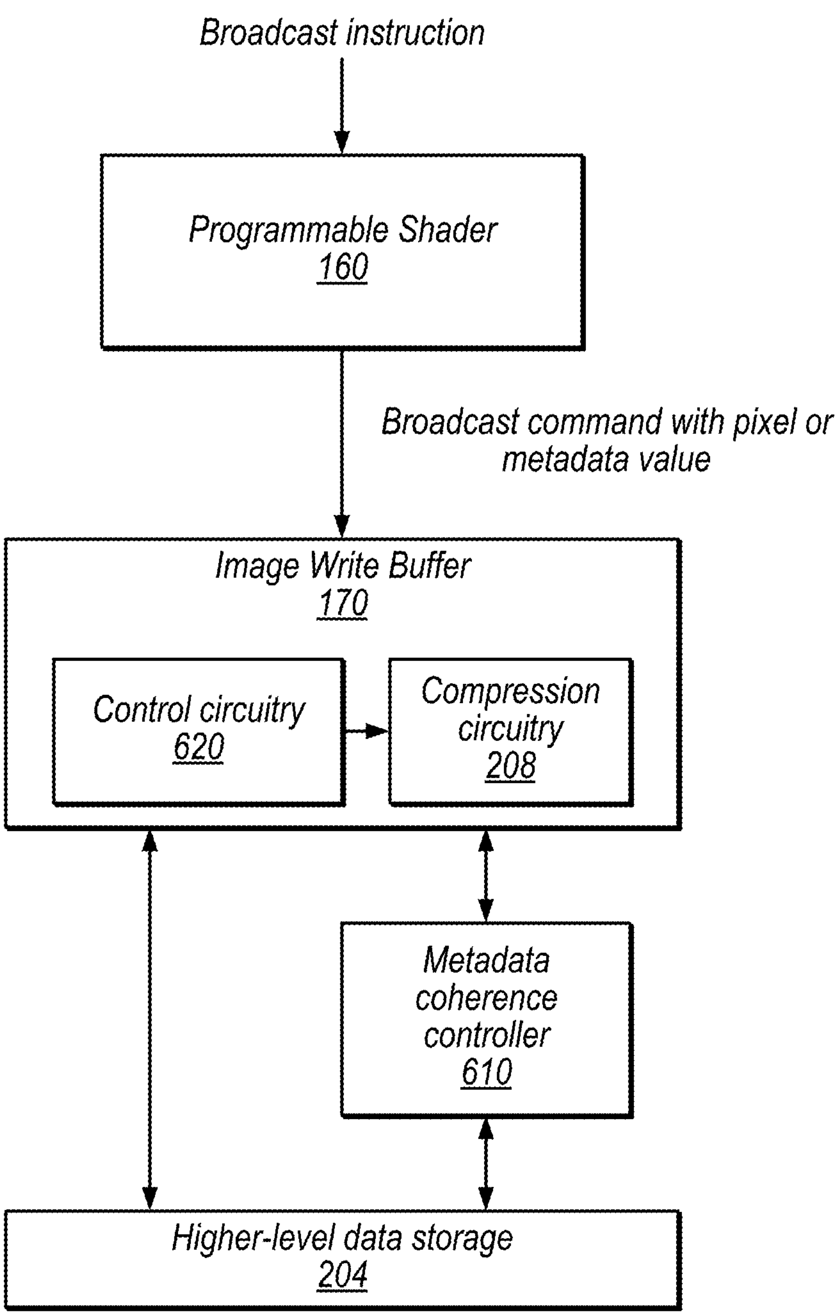
FIG. 6 is a block diagram that depicts circuitry configured to implement a broadcast command (e.g., a co-processor command) that may reduce bandwidth for replicated graphics data, according to some embodiments.

FIG. 6 is a block diagram that depicts circuitry configured to implement a broadcast command (e.g., a co-processor command) that may reduce bandwidth for replicated graphics data, according to some embodiments. Note that different detailed examples of broadcast instructions are also described below with reference to FIGS. 7A-7C. As illustrated in FIG. 6, programmable shader 160 is configured to receive and execute a broadcast instruction. Based on execution of the broadcast instruction, programmable shader 160 is configured to generate a broadcast command with a pixel value or a metadata value. Transmitting such a command may substantially reduce bandwidth, e.g., relative to sending a block of data for compression by compression circuitry 208.

FIG. 6 depicts programmable shader 160, image write buffer 170, metadata coherence controller (MDCC) 610, and higher-level data storage 204. Additionally, image write buffer 170 includes control circuitry 620 and compression circuitry 208.

Programmable shader 160 is configured to decode the broadcast instruction. The broadcast instruction may be an overloaded pixel write instruction, for example. Image write buffer 170, in some embodiments, is configured to receive and process a broadcast command generated based on the broadcast instruction. For example, control circuitry 620 may control compression circuitry 208 to perform various operations based on a given broadcast command. In this sense, the broadcast command is as a co-processor command, in some embodiments. Image write buffer 170 may also be referred to as a pixel backend (PBE). Note that image write buffer 170 may be configured to perform various other functionality, e.g., as briefly discussed above with reference to FIG. 1. For example, image write buffer 170 may operate on tiles from programmable shader 160 that are portions of a graphics frame being rendered (e.g., in tile-based deferred rendering (TBDR) architectures). Image write buffer 170 is configured to perform various tile processing operations, such as transposes, chroma compression, multi-sample anti-aliasing (MSAA) resolve, etc. Image write buffer 170 may also perform certain operations on texture data. In some architectures, image write buffer 170 is configured to perform render output unit (ROP) operations, raster operations, or both.

MDCC 610, in some embodiments, is configured to maintain coherency of compression metadata 236 stored in a shared cache such as higher-level data storage 204. MDCC 610 may also maintain read/write consistency for metadata accesses. Additionally, MDCC 610 is configured to perform one or more cache maintenance operations on higher level data storage 204. Example embodiments of MDCC 610 are discussed in U.S. patent application Ser. No. 18/795,437, titled "Coherency Control for Compressed Graphics Data" and filed Aug. 6, 2024. Generally, operations to certain cache levels by other components (e.g., by software executed by programmable shader 160) may be performed in conjunction with cache maintenance operations. For example, a cache flush invalidate (CFI) operation may be performed in conjunction with writing metadata to a certain cache level for a fast clear operation. In embodiments with coherence control hardware such as MDCC 610, performing a fast clear operation using corresponding circuitry (e.g., image write buffer 170) may advantageously reduce cache maintenance operations by taking advantage of such hardware. For example, MDCC 610 may monitor writes associated with fast clear operations at finer granularity and perform cache maintenance operations only if necessary to ensure coherence. A coherence controller that operates on metadata instead of data blocks may be particularly advantageous in the context of techniques that use special metadata values (where corresponding data blocks may not be read/written), relative to coherence controllers that impose coherence on data itself.

Figure 7A:
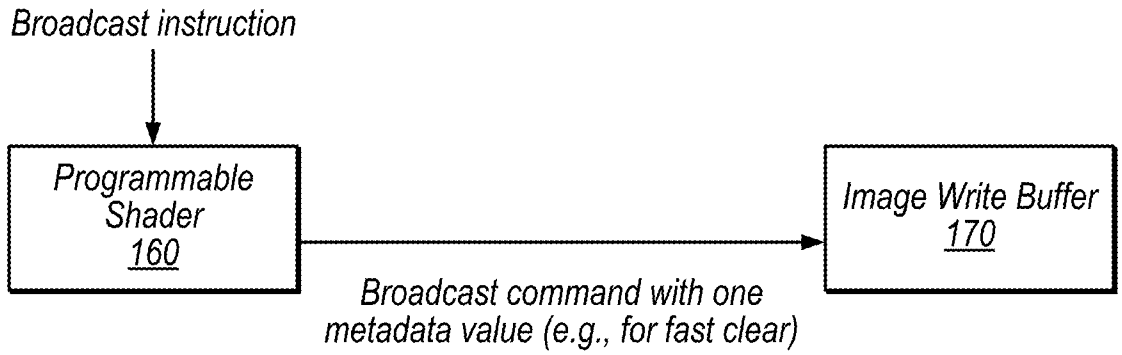
FIGS. 7A-7C are block diagrams that depict example broadcast commands, including broadcast commands for fast clear, compressed block writes, and uncompressed block writes, according to some embodiments.
Figure 7B:
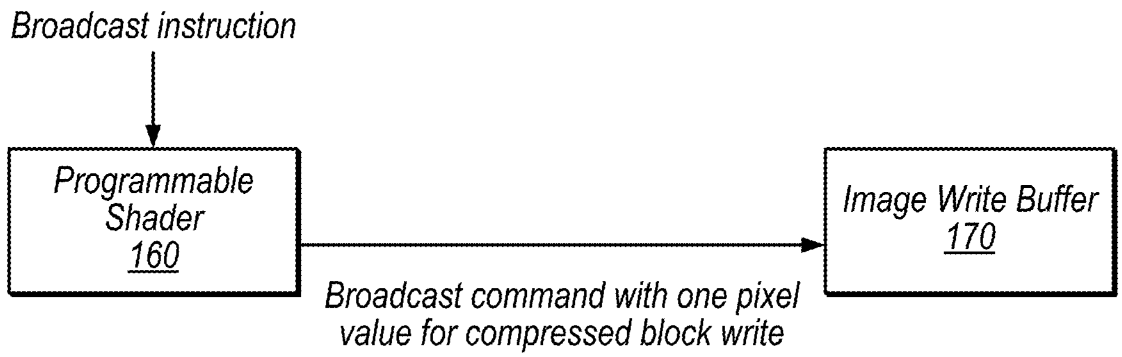
Figure 7C:
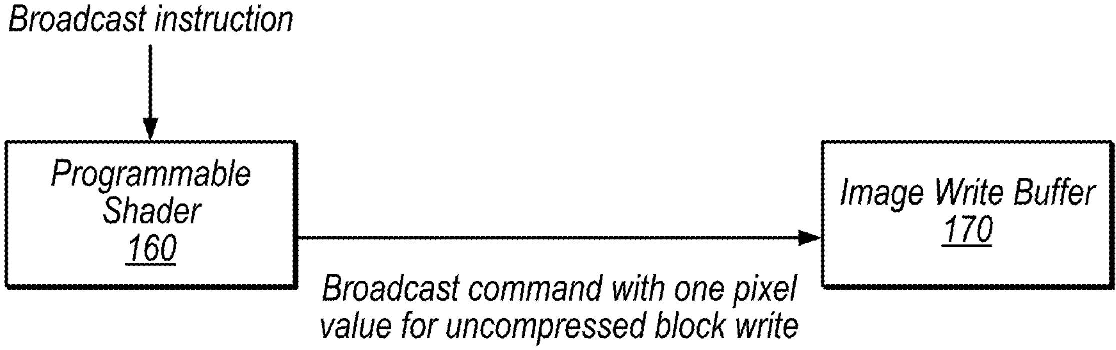

FIGS. 7A-7C are block diagrams that depict example broadcast commands, including broadcast commands for fast clear, compressed block writes, and uncompressed block writes, according to some embodiments. In these embodiments, the broadcast commands may advantageously reduce bandwidth to image write buffer 170, reduce cache maintenance operations due to coherency control by MDCC 610, reduce instructions executed for metadata address calculations, or some combination thereof.

In FIG. 7A, programmable shader 160 provides the broadcast command that includes a metadata value (e.g., a single metadata value). In response to receipt of the broadcast command, image write buffer 170 is configured to perform a fast-clear operation by writing the metadata value to higher-level data storage 204 without writing the corresponding compressed data block. Note that in some embodiments, image write buffer 170 includes circuitry configured to determine addresses of metadata for corresponding data blocks. Therefore, the command may identify a data block address and image write buffer 170 may determine the corresponding metadata address for the metadata write (e.g., at least in part based on information in a texture state word). This may advantageously obviate a need to perform the address calculation in programmable shader 160, potentially improving performance, reducing power consumption, or both.

In FIG. 7B, programmable shader 160 provides a pixel value (e.g., a single pixel) to image write buffer 170 in addition to the broadcast command. In response to receipt of the broadcast command and the pixel value, image write buffer 170 is configured to propagate the pixel value to pixels of a data block, such as uncompressed data block 216. In this manner, a block of data of any arbitrary color may be generated based on attributes (e.g., color components) of the pixel provided to image write buffer 170. Additionally, image write buffer 170 is configured to control compression circuitry 208 to compress the generated data block.

In FIG. 7C, programmable shader 160 provides a pixel value (e.g., a single pixel) to image write buffer 170 in addition to the broadcast command. In response to receipt of the broadcast command and the pixel value, image write buffer 170 is configured to propagate the pixel value to a data block, such as uncompressed data block 216. Additionally, image write buffer 170 is configured to write uncompressed data block 216 that includes the propagated pixel value to a target cache level (e.g., higher-level data storage 204 or lower-level data storage 220). In this manner, an uncompressed block of data of any arbitrary color may be generated and stored based on value(s) (e.g., a color) of the pixel provided to image write buffer 170.

Example Method

Figure 8:
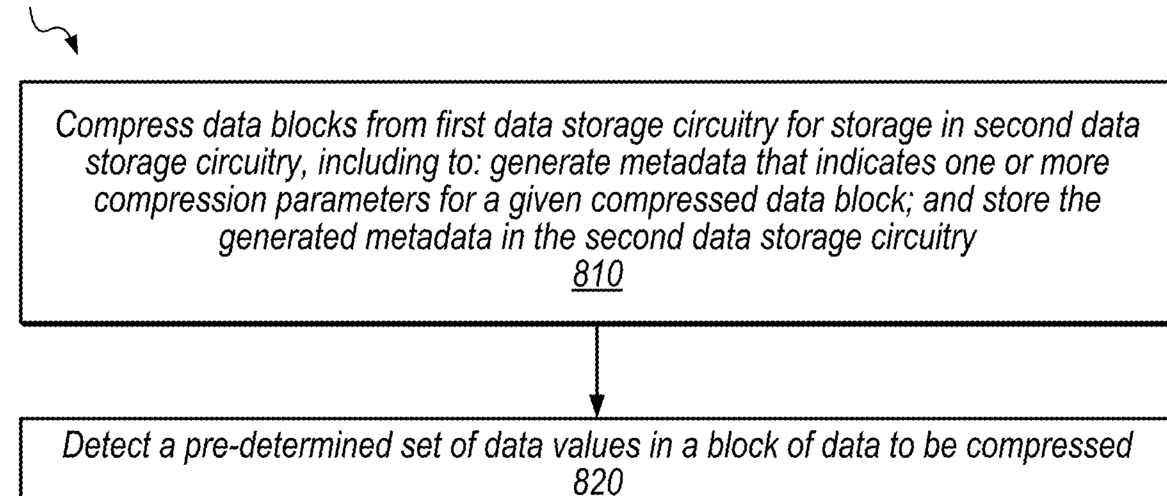
FIG. 8 is a flow diagram illustrating an example method, according to some embodiments.

FIG. 8 is a flow diagram illustrating an example method, according to some embodiments. Method 800 may be used in conjunction with any of the computer systems, devices, elements, or components disclosed herein, among other devices. In various embodiments, some of the method elements shown may be performed concurrently, in a different order than shown, or may be omitted. Additional method elements may also be performed if desired.

At 810, in the illustrated embodiment, a computing system (e.g., compression circuitry 208) compresses data blocks from first data storage circuitry for storage in second data storage circuitry, including to: generate metadata that indicates one or more compression parameters for a given compressed data block; and store the generated metadata in the second data storage circuitry.

At 820, in the illustrated embodiment, the computing system detects a pre-determined set of data values in a block of data to be compressed.

At 830, in the illustrated embodiment, for the data block determined to have the pre-determined set of data values, the computing system writes a first metadata value for the data block to second data storage circuitry to indicate compression of the data block, without writing a compressed version of the data block to the second data storage circuitry.

The computing system may include decompression circuitry configured to access metadata from the second data storage circuitry to determine the one or more compression parameters to decompress a corresponding data block. Additionally, in response to detection of the first metadata value, the decompression circuitry may be configured to generate the pre-determined set of data values for an uncompressed data block for storage in the first data storage circuitry, without reading a data block from the second data storage circuitry.

In some embodiments, in response to detection of a second metadata value, the decompression circuitry is further configured to generate a second pre-determined set of data values for a second uncompressed data block for storage in the first data storage circuitry, without reading a second data block from the second data storage circuitry.

In some embodiments, the processor execution circuitry is further configured to execute a software program to write metadata with a second metadata value to the second data storage circuitry, the second metadata value indicating, to decompression circuitry, to generate a second pre-determined set of values for a second uncompressed data block.

In some embodiments, the compression circuitry includes comparison circuitry configured to compare streaming uncompressed data, for the block of data to be compressed, with one or more pre-determined data values to detect the pre-determined set of data values.

In some embodiments, the compression circuitry supports a first-valid-pixel-fill operation, performed in response to the first metadata value, that replicates a first valid received pixel for a data block prior to compression of the data block. Additionally, the compression circuitry is further configured to determine, in response to detection of the first metadata value and based on a programming interface field in a texture state word, whether to: perform the first-valid-pixel-fill operation or write the first metadata value to the second data storage circuitry without writing a corresponding data block to the second data storage circuitry.

The computing system may include write buffer control circuitry. Additionally, the processor execution circuitry is further configured to execute a broadcast instruction and send a broadcast command to the write buffer control circuitry. The broadcast command includes the first metadata value and indicates to write the first metadata value to the second data storage circuitry without writing a corresponding data block to the second data storage circuitry.

The computing system may include metadata coherence controller circuitry configured to control coherence of metadata in the second data storage circuitry, including to perform one or more cache maintenance operations in response to the write of the first metadata value to the second data storage circuitry.

The computing system may include write buffer control circuitry configured to propagate the first pixel value to a data block and control the compression circuitry to compress the data block in response to the broadcast instruction. Additionally, the processor execution circuitry is further configured to execute a broadcast instruction and send a broadcast command to the write buffer control circuitry, the broadcast command including a first pixel value.

In some embodiments, in response to an encoding of the broadcast instruction for uncompressed data, the write buffer control circuitry is configured to propagate the first pixel value to a data block and write the data block to the second data storage circuitry

Example Device

Figure 9:
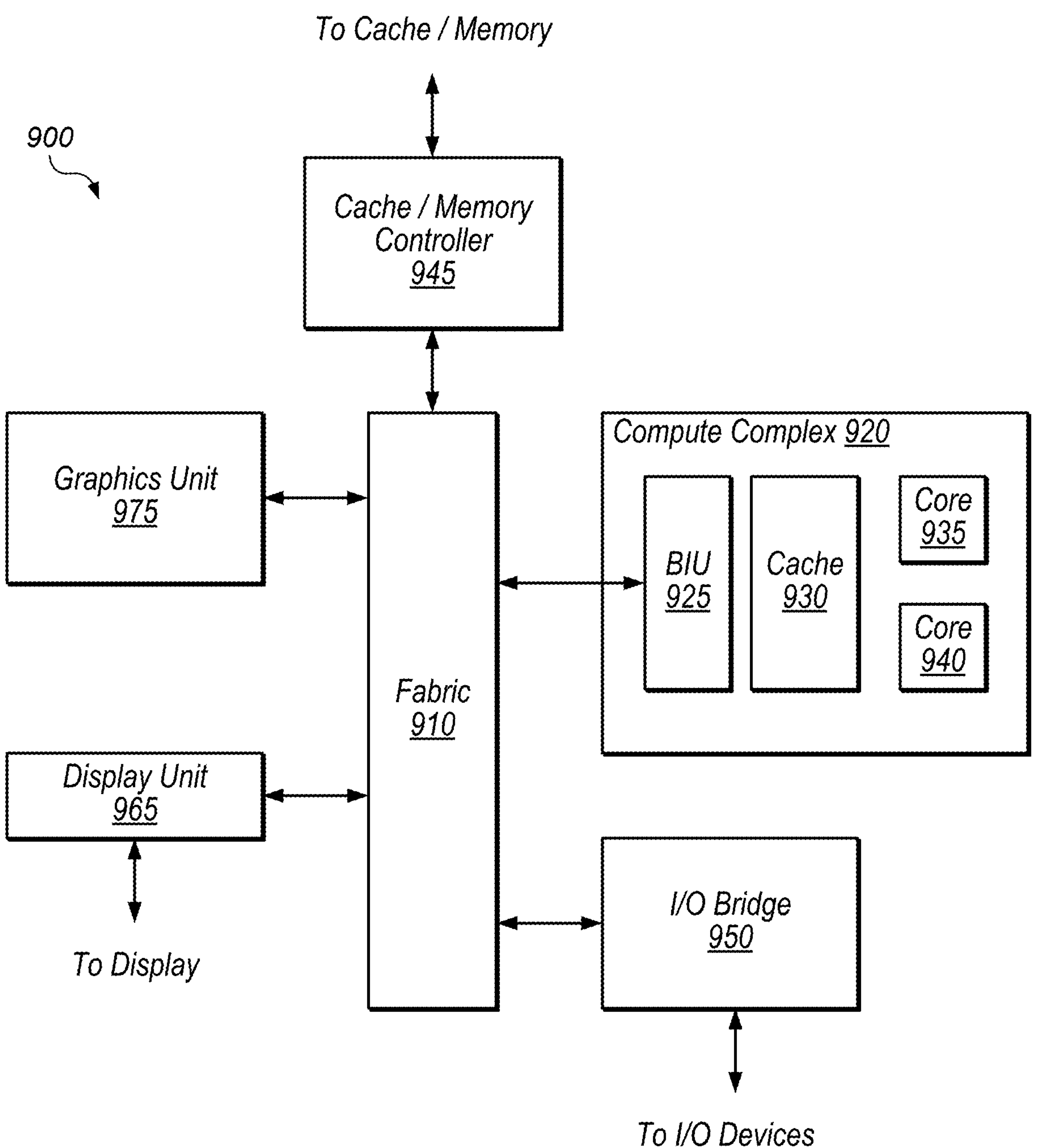
FIG. 9 is a block diagram illustrating an example computing device, according to some embodiments.

Referring now to FIG. 9, a block diagram illustrating an example embodiment of a device 900 is shown. In some embodiments, elements of device 900 may be included within a system on a chip. In some embodiments, device 900 may be included in a mobile device, which may be battery-powered. Therefore, power consumption by device 900 may be an important design consideration. In the illustrated embodiment, device 900 includes fabric 910, compute complex 920, input/output (I/O) bridge 950, cache/memory controller 945, graphics unit 975, and display unit 965. In some embodiments, device 900 may include other components (not shown) in addition to or in place of the illustrated components, such as video processor encoders and decoders, image processing or recognition elements, computer vision elements, etc. Graphics unit 975 may correspond to graphics unit 150.

Fabric 910 may include various interconnects, buses, MUX's, controllers, etc., and may be configured to facilitate communication between various elements of device 900. In some embodiments, portions of fabric 910 may be configured to implement various different communication protocols. In other embodiments, fabric 910 may implement a single communication protocol and elements coupled to fabric 910 may convert from the single communication protocol to other communication protocols internally.

In the illustrated embodiment, compute complex 920 includes bus interface unit (BIU) 925, cache 930, and cores 935 and 940. In various embodiments, compute complex 920 may include various numbers of processors, processor cores and caches. For example, compute complex 920 may include 1, 2, or 4 processor cores, or any other suitable number. In one embodiment, cache 930 is a set associative L2 cache. In some embodiments, cores 935 and 940 may include internal instruction and data caches. In some embodiments, a coherency unit (not shown) in fabric 910, cache 930, or elsewhere in device 900 may be configured to maintain coherency between various caches of device 900. BIU 925 may be configured to manage communication between compute complex 920 and other elements of device 900. Processor cores such as cores 935 and 940 may be configured to execute instructions of a particular instruction set architecture (ISA) which may include operating system instructions and user application instructions. These instructions may be stored in computer readable medium such as a memory coupled to memory controller 945 discussed below.

In some embodiments, compute complex 920 implements various disclosed fast clear techniques for blocks of data, which may improve its performance, reduce its power consumption, or some combination thereof for certain workloads.

As used herein, the term "coupled to" may indicate one or more connections between elements, and a coupling may include intervening elements. For example, in FIG. 9, graphics unit 975 may be described as "coupled to" a memory through fabric 910 and cache/memory controller 945. In contrast, in the illustrated embodiment of FIG. 9, graphics unit 975 is "directly coupled" to fabric 910 because there are no intervening elements.

Cache/memory controller 945 may be configured to manage transfer of data between fabric 910 and one or more caches and memories. For example, cache/memory controller 945 may be coupled to an L3 cache, which may in turn be coupled to a system memory. In other embodiments, cache/memory controller 945 may be directly coupled to a memory. In some embodiments, cache/memory controller 945 may include one or more internal caches. Memory coupled to controller 945 may be any type of volatile memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR4, etc.), RAMBUS DRAM (RDRAM), static RAM (SRAM), etc. One or more memory devices may be coupled onto a circuit board to form memory modules such as single inline memory modules (SIMMs), dual inline memory modules (DIMMs), etc. Alternatively, the devices may be mounted with an integrated circuit in a chip-on-chip configuration, a package-on-package configuration, or a multi-chip module configuration. Memory coupled to controller 945 may be any type of non-volatile memory such as NAND flash memory, NOR flash memory, nano RAM (NRAM), magneto-resistive RAM (MRAM), phase change RAM (PRAM), Racetrack memory, Memristor memory, etc. As noted above, this memory may store program instructions executable by compute complex 920 to cause the computing device to perform functionality described herein.

Graphics unit 975 may include one or more processors, e.g., one or more graphics processing units (GPU's). Graphics unit 975 may receive graphics-oriented instructions, such as OPENGL®, Metal, or DIRECT3D® instructions, for example. Graphics unit 975 may execute specialized GPU instructions or perform other operations based on the received graphics-oriented instructions. Graphics unit 975 may generally be configured to process large blocks of data in parallel and may build images in a frame buffer for output to a display, which may be included in the device or may be a separate device. Graphics unit 975 may include transform, lighting, triangle, and rendering engines in one or more graphics processing pipelines. Graphics unit 975 may output pixel information for display images. Graphics unit 975, in various embodiments, may include programmable shader circuitry which may include highly parallel execution cores configured to execute graphics programs, which may include pixel tasks, vertex tasks, and compute tasks (which may or may not be graphics-related).

In some embodiments, graphics unit 975 implements various disclosed fast clear techniques, which may improve its performance, reduce its power consumption, or some combination thereof.

Display unit 965 may be configured to read data from a frame buffer and provide a stream of pixel values for display. Display unit 965 may be configured as a display pipeline in some embodiments. Additionally, display unit 965 may be configured to blend multiple frames to produce an output frame. Further, display unit 965 may include one or more interfaces (e.g., MIPI® or embedded display port (eDP)) for coupling to a user display (e.g., a touchscreen or an external display).

I/O bridge 950 may include various elements configured to implement: universal serial bus (USB) communications, security, audio, and low-power always-on functionality, for example. I/O bridge 950 may also include interfaces such as pulse-width modulation (PWM), general-purpose input/output (GPIO), serial peripheral interface (SPI), and inter-integrated circuit (I2C), for example. Various types of peripherals and devices may be coupled to device 900 via I/O bridge 950.

In some embodiments, device 900 includes network interface circuitry (not explicitly shown), which may be connected to fabric 910 or I/O bridge 950. The network interface circuitry may be configured to communicate via various networks, which may be wired, wireless, or both. For example, the network interface circuitry may be configured to communicate via a wired local area network, a wireless local area network (e.g., via Wi-Fi™), or a wide area network (e.g., the Internet or a virtual private network). In some embodiments, the network interface circuitry is configured to communicate via one or more cellular networks that use one or more radio access technologies. In some embodiments, the network interface circuitry is configured to communicate using device-to-device communications (e.g., Bluetooth® or Wi-Fi™ Direct), etc. In various embodiments, the network interface circuitry may provide device 900 with connectivity to various types of other devices and networks.

Example Applications

Figure 10:
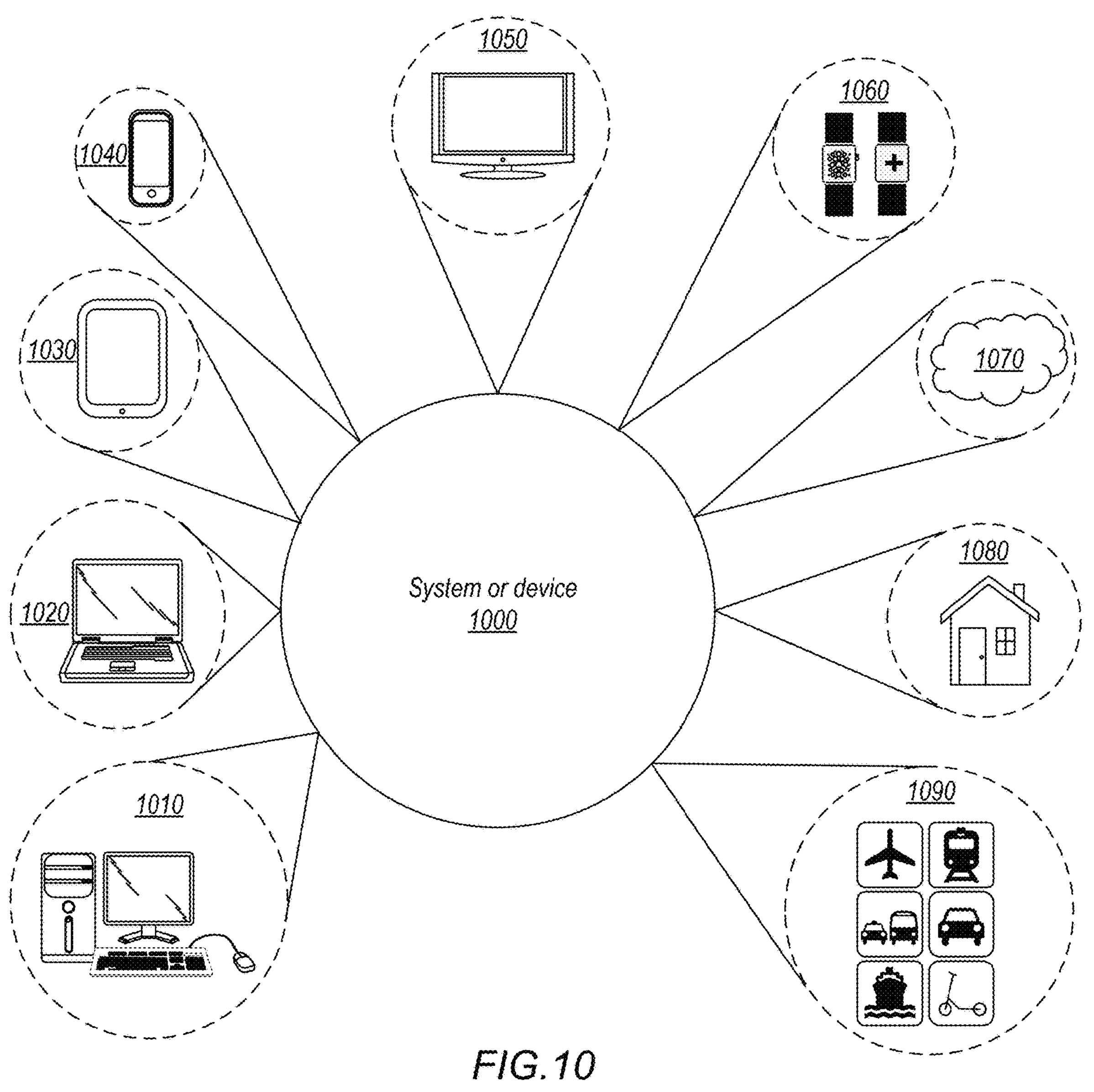
FIG. 10 is a diagram illustrating example applications of disclosed systems and devices, according to some embodiments.

Turning now to FIG. 10, various types of systems that may include any of the circuits, devices, or system discussed above. System or device 1000, which may incorporate or otherwise utilize one or more of the techniques described herein, may be utilized in a wide range of areas. For example, system or device 1000 may be utilized as part of the hardware of systems such as a desktop computer 1010, laptop computer 1020, tablet computer 1030, cellular or mobile phone 1040, or television 1050 (or set-top box coupled to a television).

Similarly, disclosed elements may be utilized in a wearable device 1060, such as a smartwatch or a health-monitoring device. Smartwatches, in many embodiments, may implement a variety of different functions—for example, access to email, cellular service, calendar, health monitoring, etc. A wearable device may also be designed solely to perform health-monitoring functions, such as monitoring a user's vital signs, performing epidemiological functions such as contact tracing, providing communication to an emergency medical service, etc. Other types of devices are also contemplated, including devices worn on the neck, devices implantable in the human body, glasses or a helmet designed to provide computer-generated reality experiences such as those based on augmented and/or virtual reality, etc.

System or device 1000 may also be used in various other contexts. For example, system or device 1000 may be utilized in the context of a server computer system, such as a dedicated server or on shared hardware that implements a cloud-based service 1070. Still further, system or device 1000 may be implemented in a wide range of specialized everyday devices, including devices 1080 commonly found in the home such as refrigerators, thermostats, security cameras, etc. The interconnection of such devices is often referred to as the "Internet of Things" (IoT). Elements may also be implemented in various modes of transportation. For example, system or device 1000 could be employed in the control systems, guidance systems, entertainment systems, etc. of various types of vehicles 1090.

The applications illustrated in FIG. 10 are merely exemplary and are not intended to limit the potential future applications of disclosed systems or devices. Other example applications include, without limitation: portable gaming devices, music players, data storage devices, unmanned aerial vehicles, etc.

Example Computer-Readable Medium

The present disclosure has described various example circuits in detail above. It is intended that the present disclosure cover not only embodiments that include such circuitry, but also a computer-readable storage medium that includes design information that specifies such circuitry. Accordingly, the present disclosure is intended to support claims that cover not only an apparatus that includes the disclosed circuitry, but also a storage medium that specifies the circuitry in a format that is recognized by a computing system configured to generate a simulation model of the hardware circuit, by a fabrication system configured to produce hardware (e.g., an integrated circuit) that includes the disclosed circuitry, etc. Claims to such a storage medium are intended to cover, for example, an entity that produces a circuit design, but does not itself perform complete operations such as: design simulation, design synthesis, circuit fabrication, etc.

Figure 11:
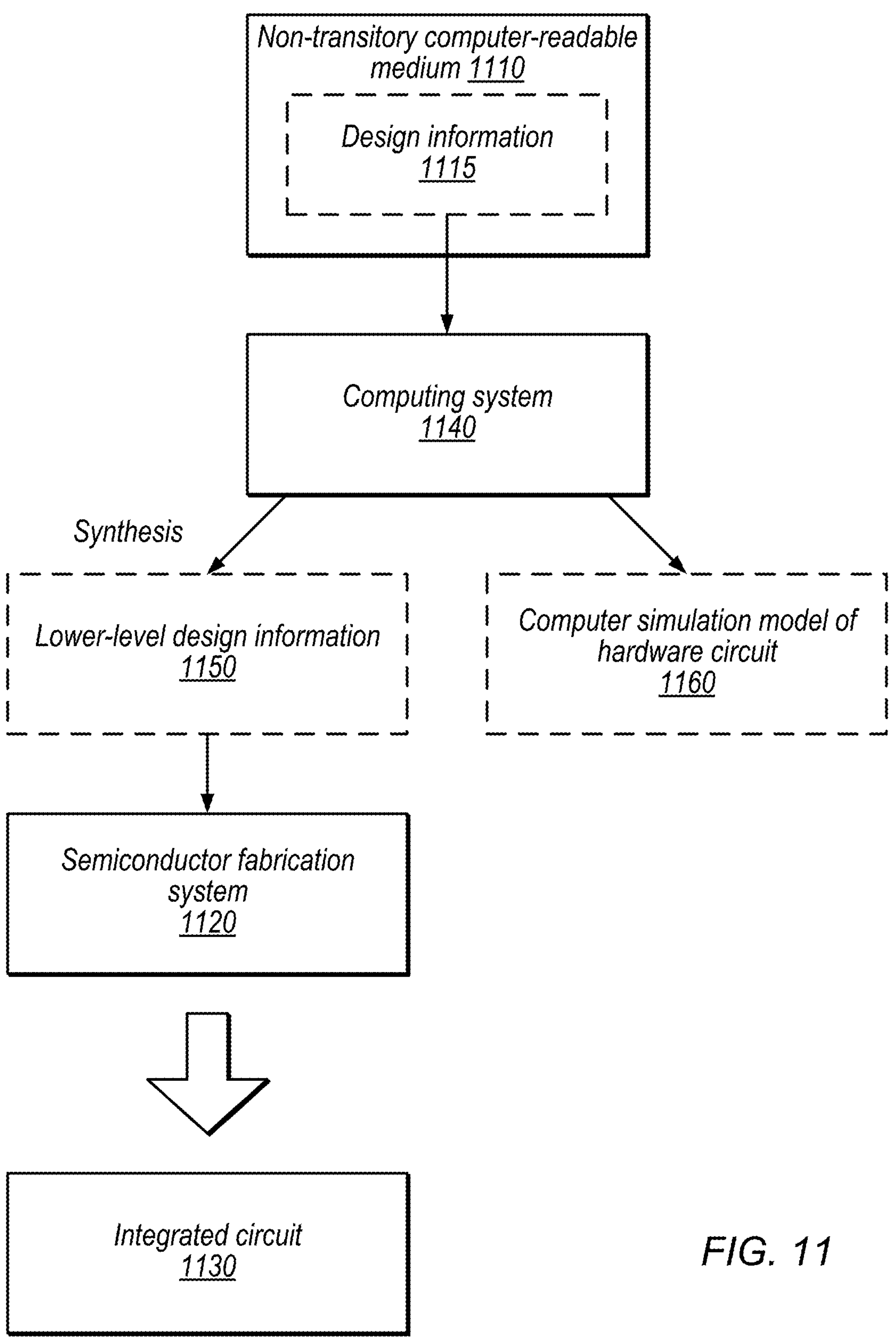
FIG. 11 is a block diagram illustrating an example computer-readable medium that stores circuit design information, according to some embodiments.

FIG. 11 is a block diagram illustrating an example non-transitory computer-readable storage medium that stores circuit design information, according to some embodiments. In the illustrated embodiment, computing system 1140 is configured to process the design information. This may include executing instructions included in the design information, interpreting instructions included in the design information, compiling, transforming, or otherwise updating the design information, etc. Therefore, the design information controls computing system 1140 (e.g., by programming computing system 1140) to perform various operations discussed below, in some embodiments.

In the illustrated example, computing system 1140 processes the design information to generate both a computer simulation model of a hardware circuit 1160 and lower-level design information 1150. In other embodiments, computing system 1140 may generate only one of these outputs, may generate other outputs based on the design information, or both. Regarding the computing simulation, computing system 1140 may execute instructions of a hardware description language that includes register transfer level (RTL) code, behavioral code, structural code, or some combination thereof. The simulation model may perform the functionality specified by the design information, facilitate verification of the functional correctness of the hardware design, generate power consumption estimates, generate timing estimates, etc.

In the illustrated example, computing system 1140 also processes the design information to generate lower-level design information 1150 (e.g., gate-level design information, a netlist, etc.). This may include synthesis operations, as shown, such as constructing a multi-level network, optimizing the network using technology-independent techniques, technology dependent techniques, or both, and outputting a network of gates (with potential constraints based on available gates in a technology library, sizing, delay, power, etc.). Based on lower-level design information 1150 (potentially among other inputs), semiconductor fabrication system 1120 is configured to fabricate an integrated circuit 1130 (which may correspond to functionality of the simulation model 1160). Note that computing system 1140 may generate different simulation models based on design information at various levels of description, including information 1150, 1115, and so on. The data representing design information 1150 and model 1160 may be stored on medium 1110 or on one or more other media.

In some embodiments, the lower-level design information 1150 controls (e.g., programs) the semiconductor fabrication system 1120 to fabricate the integrated circuit 1130. Thus, when processed by the fabrication system, the design information may program the fabrication system to fabricate a circuit that includes various circuitry disclosed herein.

Non-transitory computer-readable storage medium 1110, may comprise any of various appropriate types of memory devices or storage devices. Non-transitory computer-readable storage medium 1110 may be an installation medium, e.g., a CD-ROM, floppy disks, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. Non-transitory computer-readable storage medium 1110 may include other types of non-transitory memory as well or combinations thereof. Accordingly, non-transitory computer-readable storage medium 1110 may include two or more memory media; such media may reside in different locations—for example, in different computer systems that are connected over a network.

Design information 1115 may be specified using any of various appropriate computer languages, including hardware description languages such as, without limitation: VHDL, Verilog, SystemC, SystemVerilog, RHDL, M, MyHDL, etc. The format of various design information may be recognized by one or more applications executed by computing system 1140, semiconductor fabrication system 1120, or both. In some embodiments, design information may also include one or more cell libraries that specify the synthesis, layout, or both of integrated circuit 1130. In some embodiments, the design information is specified in whole or in part in the form of a netlist that specifies cell library elements and their connectivity. Design information discussed herein, taken alone, may or may not include sufficient information for fabrication of a corresponding integrated circuit. For example, design information may specify the circuit elements to be fabricated but not their physical layout. In this case, design information may be combined with layout information to actually fabricate the specified circuitry.

Integrated circuit 1130 may, in various embodiments, include one or more custom macrocells, such as memories, analog or mixed-signal circuits, and the like. In such cases, design information may include information related to included macrocells. Such information may include, without limitation, schematics capture database, mask design data, behavioral models, and device or transistor level netlists. Mask design data may be formatted according to graphic data system (GDSII), or any other suitable format.

Semiconductor fabrication system 1120 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 1120 may also be configured to perform various testing of fabricated circuits for correct operation.

In various embodiments, integrated circuit 1130 and model 1160 are configured to operate according to a circuit design specified by design information 1115, which may include performing any of the functionality described herein. For example, integrated circuit 1130 may include any of various elements shown in at least FIGS. 1B, 2, 4, 6, 7A-C, and 9. Further, integrated circuit 1130 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components. Similarly, stating "instructions of a hardware description programming language" that are "executable" to program a computing system to generate a computer simulation model" does not imply that the instructions must be executed in order for the element to be met, but rather specifies characteristics of the instructions. Additional features relating to the model (or the circuit represented by the model) may similarly relate to characteristics of the instructions, in this context. Therefore, an entity that sells a computer-readable medium with instructions that satisfy recited characteristics may provide an infringing product, even if another entity actually executes the instructions on the medium.

Note that a given design, at least in the digital logic context, may be implemented using a multitude of different gate arrangements, circuit technologies, etc. Once a digital logic design is specified, however, those skilled in the art need not perform substantial experimentation or research to determine those implementations. Rather, those of skill in the art understand procedures to reliably and predictably produce one or more circuit implementations that provide the function described by the design information. The different circuit implementations may affect the performance, area, power consumption, etc. of a given design (potentially with tradeoffs between different design goals), but the logical function does not vary among the different circuit implementations of the same circuit design.

In some embodiments, the instructions included in the design information instructions provide RTL information (or other higher-level design information) and are executable by the computing system to synthesize a gate-level netlist that represents the hardware circuit based on the RTL information as an input. Similarly, the instructions may provide behavioral information and be executable by the computing system to synthesize a netlist or other lower-level design information. The lower-level design information may program fabrication system 1120 to fabricate integrated circuit 1130.

The various techniques described herein may be performed by one or more computer programs. The term "program" is to be construed broadly to cover a sequence of instructions in a programming language that a computing device can execute. These programs may be written in any suitable computer language, including lower-level languages such as assembly and higher-level languages such as Python. The program may be written in a compiled language such as C or C++, or an interpreted language such as JavaScript.

Program instructions may be stored on a "computer-readable storage medium" or a "computer-readable medium" in order to facilitate execution of the program instructions by a computer system. Generally speaking, these phrases include any tangible or non-transitory storage or memory medium. The terms "tangible" and "non-transitory" are intended to exclude propagating electromagnetic signals, but not to otherwise limit the type of storage medium. Accordingly, the phrases "computer-readable storage medium" or a "computer-readable medium" are intended to cover types of storage devices that do not necessarily store information permanently (e.g., random access memory (RAM)). The term "non-transitory," accordingly, is a limitation on the nature of the medium itself (i.e., the medium cannot be a signal) as opposed to a limitation on data storage persistency of the medium (e.g., RAM vs. ROM).

The phrases "computer-readable storage medium" and "computer-readable medium" are intended to refer to both a storage medium within a computer system as well as a removable medium such as a CD-ROM, memory stick, or portable hard drive. The phrases cover any type of volatile memory within a computer system including DRAM, DDR RAM, SRAM, EDO RAM, Rambus RAM, etc., as well as non-volatile memory such as magnetic media, e.g., a hard drive, or optical storage. The phrases are explicitly intended to cover the memory of a server that facilitates downloading of program instructions, the memories within any intermediate computer system involved in the download, as well as the memories of all destination computing devices. Still further, the phrases are intended to cover combinations of different types of memories.

In addition, a computer-readable medium or storage medium may be located in a first set of one or more computer systems in which the programs are executed, as well as in a second set of one or more computer systems which connect to the first set over a network. In the latter instance, the second set of computer systems may provide program instructions to the first set of computer systems for execution. In short, the phrases "computer-readable storage medium" and "computer-readable medium" may include two or more media that may reside in different locations, e.g., in different computers that are connected over a network.

The present disclosure includes references to "an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more of the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" or is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as being "configured to" perform some task refers to something physical, such as a device, circuit, a system having a processor unit and a memory storing program instructions executable to implement the task, etc. This phrase is not used herein to refer to something intangible.

In some cases, various units/circuits/components may be described herein as performing a set of tasks or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112(f) for that claim element. Should Applicant wish to invoke Section 112(f) during prosecution of a United States patent application based on this disclosure, it will recite claim elements using the "means for"[performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), functional unit, memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements may be defined by the functions or operations that they are configured to implement. The arrangement and such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and other circuit elements (e.g., passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

The invention claimed is:

1. An apparatus, comprising:

first data storage circuitry;

second data storage circuitry;

processor execution circuitry configured to execute instructions that operate on data in the first data storage circuitry; and compression circuitry configured to:

compress data blocks from the first data storage circuitry for storage in the second data storage circuitry, including to generate metadata that indicates one or more compression parameters for a given compressed data block and store the generated metadata in the second data storage circuitry;

detect a pre-determined set of data values in a block of data to be compressed; and for the data block determined to have the pre-determined set of data values, write a first metadata value for the data block to the second data storage circuitry to indicate compression of the data block, without writing a compressed version of the data block to the second data storage circuitry.

2. The apparatus of claim 1, further comprising:

decompression circuitry configured to:

access metadata from the second data storage circuitry to determine the one or more compression parameters to decompress a corresponding data block; and in response to detection of the first metadata value, generate the pre-determined set of data values for an uncompressed data block for storage in the first data storage circuitry, without reading a data block from the second data storage circuitry.

3. The apparatus of claim 2, wherein the decompression circuitry is further configured to, in response to detection of a second metadata value, generate a second pre-determined set of data values for a second uncompressed data block for storage in the first data storage circuitry, without reading a second data block from the second data storage circuitry.

4. The apparatus of claim 1, wherein the processor execution circuitry is further configured to execute a software program to write metadata with a second metadata value to the second data storage circuitry, the second metadata value indicating, to decompression circuitry, to generate a second pre-determined set of values for a second uncompressed data block.

5. The apparatus of claim 1, wherein the compression circuitry includes comparison circuitry configured to compare streaming uncompressed data, for the block of data to be compressed, with one or more pre-determined data values to detect the pre-determined set of data values.

6. The apparatus of claim 1, wherein:

the compression circuitry supports a first-valid-pixel-fill operation, performed in response to the first metadata value, that replicates a first valid received pixel for a data block prior to compression of the data block; and the compression circuitry is further configured to determine, in response to detection of the first metadata value and based on a programming interface field in a texture state word, whether to:

perform the first-valid-pixel-fill operation; or write the first metadata value to the second data storage circuitry without writing a corresponding data block to the second data storage circuitry.

7. The apparatus of claim 1, wherein:

the apparatus further comprises write buffer control circuitry; and the processor execution circuitry is further configured to execute a broadcast instruction and send a broadcast command to the write buffer control circuitry, wherein the broadcast command includes the first metadata value and indicates to write the first metadata value to the second data storage circuitry without writing a corresponding data block to the second data storage circuitry.

8. The apparatus of claim 7, further comprising:

metadata coherence controller circuitry configured to control coherence of the metadata in the second data storage circuitry, including to perform one or more cache maintenance operations in response to the write of the first metadata value to the second data storage circuitry.

9. The apparatus of claim 1, wherein:

the apparatus further comprises write buffer control circuitry; and the processor execution circuitry is further configured to execute a broadcast instruction and send a broadcast command to the write buffer control circuitry, the broadcast command including a first pixel value; and the write buffer control circuitry is configured to propagate the first pixel value to a data block and control the compression circuitry to compress the data block in response to the broadcast instruction.

10. The apparatus of claim 9, wherein, in response to an encoding of the broadcast instruction for uncompressed data, the write buffer control circuitry is configured to propagate the first pixel value to a data block and write the data block to the second data storage circuitry.

11. The apparatus of claim 1, wherein:

the processor execution circuitry, compression circuitry, and decompression circuitry are included in a graphics processor; and the apparatus is a computing device that further includes:

a central processing unit;

a display; and network interface circuitry.

12. A method comprising:

compressing, by compression circuitry, data blocks from first data storage circuitry for storage in second data storage circuitry, including to:

generate metadata that indicates one or more compression parameters for a given compressed data block; and store the generated metadata in the second data storage circuitry;

detecting, by the compression circuitry, a pre-determined set of data values in a block of data to be compressed; and writing, for the data block determined to have the pre-determined set of data values, a first metadata value for the data block to the second data storage circuitry to indicate compression of the data block, without writing a compressed version of the data block to the second data storage circuitry.

13. The method of claim 12, further comprising:

accessing, by decompression circuitry, the metadata from the second data storage circuitry to determine the one or more compression parameters to decompress a corresponding data block; and in response to detection of the first metadata value, generating the pre-determined set of data values for an uncompressed data block for storage in the first data storage circuitry, without reading a data block from the second data storage circuitry.

14. The method of claim 12, further comprising:

executing, by processor execution circuitry, a software program to write metadata with a second metadata value to the second data storage circuitry, the second metadata value indicating, to decompression circuitry, to generate a second pre-determined set of values for a second uncompressed data block, the second pre-determined set of values distinct from the pre-determined set of values.

15. The method of claim 12, further comprising:

executing, by processor execution circuitry, a broadcast instruction; and sending, by the processor execution circuitry, a broadcast command to write buffer control circuitry, wherein the broadcast command includes the first metadata value and indicates to write the first metadata value to the second data storage circuitry without writing a corresponding data block to the second data storage circuitry.

16. A non-transitory computer readable storage medium having stored thereon design information that specifies a design of at least a portion of a hardware integrated circuit in a format recognized by a semiconductor fabrication system that is configured to use the design information to produce the circuit according to the design, including:

first data storage circuitry;

second data storage circuitry;

processor execution circuitry configured to execute instructions that operate on data in the first data storage circuitry;

compression circuitry configured to:

compress data blocks from the first data storage circuitry for storage in the second data storage circuitry, including to generate metadata that indicates one or more compression parameters for a given compressed data block and store the generated metadata in the second data storage circuitry;

detect a pre-determined set of data values in a block of data to be compressed; and for the data block determined to have the pre-determined set of data values, write a first metadata value for the data block to the second data storage circuitry to indicate compression of the data block, without writing a compressed version of the data block to the second data storage circuitry.

17. The non-transitory computer readable storage medium of claim 16, wherein the design information further specifies:

decompression circuitry configured to:

access metadata from the second data storage circuitry to determine the one or more compression parameters to decompress a corresponding data block; and in response to detection of the first metadata value, generate the pre-determined set of data values for an uncompressed data block for storage in the first data storage circuitry, without reading a data block from the second data storage circuitry.

18. The non-transitory computer readable storage medium of claim 17, wherein the decompression circuitry is further configured to, in response to detection of a second metadata value, generate a second pre-determined set of data values for a second uncompressed data block for storage in the first data storage circuitry, without reading a second data block.

19. The non-transitory computer readable storage medium of claim 16, wherein the design information further specifies that the compression circuitry includes comparison circuitry configured to compare streaming uncompressed data, for the block of data to be compressed, with one or more pre-determined data values to detect the pre-determined set of data values.

20. The non-transitory computer readable storage medium of claim 19, wherein the design information further specifies write buffer control circuitry, and wherein:

the processor execution circuitry is further configured to execute a broadcast instruction and send a broadcast command to the write buffer control circuitry, wherein the broadcast command includes the first metadata value and indicates to write the first metadata value to the second data storage circuitry without writing a corresponding data block to the second data storage circuitry.

* * * * *